(12) United States Patent
Miyazaki

(10) Patent No.: US 9,703,214 B2
(45) Date of Patent: Jul. 11, 2017

(54) LITHOGRAPHY APPARATUS, LITHOGRAPHY METHOD, AND ARTICLE MANUFACTURING METHOD

(71) Applicant: CANON KABUSHIKI KAISHA, Tokyo (JP)

(72) Inventor: Tadaki Miyazaki, Utsunomiya (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 0 days.

(21) Appl. No.: 14/334,230

(22) Filed: Jul. 17, 2014

(65) Prior Publication Data

US 2015/0022797 A1 Jan. 22, 2015

(30) Foreign Application Priority Data

Jul. 19, 2013 (JP) .................................. 2013-150721

(51) Int. Cl.
*G03B 27/54* (2006.01)
*G03F 9/00* (2006.01)
*G03F 7/20* (2006.01)

(52) U.S. Cl.
CPC ........ *G03F 9/7046* (2013.01); *G03F 7/70616* (2013.01)

(58) Field of Classification Search
CPC ... G03F 7/70616; G03F 9/7046; G03F 9/7026
USPC ........................................ 355/52, 53, 55, 67
See application file for complete search history.

(56) References Cited

U.S. PATENT DOCUMENTS

| 5,521,036 A * | 5/1996 | Iwamoto | G03F 9/7026 250/548 |
| 6,411,386 B1 * | 6/2002 | Nishi | G01B 11/26 356/399 |
| 7,224,459 B2 | 5/2007 | Morimoto | |
| 2002/0042664 A1 * | 4/2002 | Kikuchi | G03F 9/7003 700/114 |
| 2005/0099628 A1 * | 5/2005 | Kokumai | G03F 9/7076 356/401 |

FOREIGN PATENT DOCUMENTS

JP 2003-100604 A 4/2003

* cited by examiner

*Primary Examiner* — Hung Henry Nguyen
(74) *Attorney, Agent, or Firm* — Rossi, Kimms & McDowell LLP

(57) ABSTRACT

Provided is a lithography apparatus which forms a pattern on a substrate that includes a detector configured to detect a mark formed on the substrate; a controller configured to obtain a displacement amount of a position of the mark from a reference position thereof based on an output of the detector; wherein the controller is configured to obtain a representative value of, with respect to each of a plurality of marks associated with each sample shot region on the substrate, a plurality of the displacement amount respectively obtained based on outputs of the detector with respect to a plurality of the sample shot region, and obtain information relating to a form of a shot region on the substrate based on a plurality of the representative value respectively obtained with respect to the plurality of marks.

10 Claims, 10 Drawing Sheets

LITHOGRAPHY APPARATUS, LITHOGRAPHY METHOD, AND ARTICLE MANUFACTURING METHOD

BACKGROUND OF THE INVENTION

Field of the Invention

The present invention relates to a lithography apparatus, a lithography method, and an article manufacturing method.

Description of the Related Art

In a lithography process included in a manufacturing process of articles such as semiconductor devices or liquid crystal display devices, a lithography apparatus forms a machining pattern on a work piece (e.g., a substrate). The pertinent pattern may include a latent image pattern in a resist, or a pattern of a resist itself. An exposure apparatus, which is an example of this lithography apparatus, projects a pattern that is pre-formed on an original (a reticle, mask, or the like) via a projection optical system, and exposes a substrate (a wafer, glass plate, or the like) to which a photosensitizer has been applied. With this exposure apparatus, prior to exposure, positioning (alignment) is conducted to overlay the pattern formed in the original onto a pattern formed on a substrate.

For the pertinent alignment, the AGA (advanced global alignment) method is known as a technique for obtaining positions of each of various shot regions on a substrate. With the AGA method, first, several sample shot regions are selected from among all shot regions on a substrate, and a positional displacement amount of each sample shot region from its design position (reference position, or position in terms of design) is measured. Based on the obtained measurement results, correction parameters (hereinafter "substrate correction parameters") are then obtained in order to obtain the positions of the respective shot regions from their design positions (correct the design positions). The pertinent substrate correction parameter may serve as a coefficient of a formula (regression formula) for conversion from a previously prepared design position of a given shot region to a (actual or measured) position of a given shot region. The pertinent coefficient may be obtained by regression computation based on the pertinent conversion formula and the aforementioned measurement results. To increase the precision of overlay, in addition to substrate correction parameters, there are also techniques for obtaining parameters (hereinafter "shot correction parameters") for obtaining the forms of shot regions (correcting a design form (a reference form, or a form in terms of design) of shot regions). The form of a shot region typically pertains to magnification and rotation respectively relating to the X axis and the Y axis. The pertinent shot correction parameter may be used as a coefficient for a formula (regression formula) for converting from a previously prepared design position inside a given shot region to a (actual or measured) position inside a given shot region. The pertinent coefficient may be obtained by regression computation based on the pertinent conversion formula and the aforementioned measurement results. The causes of shot region deformation include those deriving from the exposure step such as distortion of the projection optical system, and those deriving from other steps such as substrate deformation in steps other than the exposure step involving heat.

With the AGA method, the position of a mark (alignment mark) corresponding to a shot region is measured to obtain a displacement amount of a representative position (normally the center) of a shot region from its design position. FIG. 9 consists of plan views which show mark arrangements pertaining to a conventional shot region SH. FIG. 9(a) is a drawing which exemplifies an arrangement of marks related to a shot region SH that are required to obtain a substrate correction parameter. There is arrangement of a mark MX1 for measurement of a position in the X axis direction, and a mark MY1 for measurement of a position in the Y axis direction. On the other hand, FIG. 9(b) is a drawing which exemplifies an arrangement of marks related to a shot region SH that are required to obtain a shot correction parameter. A larger number of marks (marks MX1-MX3, and marks MY1-MY3) are arranged than in FIG. 9(a). FIG. 10 is a plan view which exemplifies an arrangement of sample shot regions SH on a substrate W. Two sample shot regions SH1 and SH2 like the one shown in FIG. 9(b) are set up on the substrate W for obtaining shot correction parameters. Four sample shot regions SH3-SH6 like the one shown in FIG. 9(a) are set up on the substrate W for obtaining substrate correction parameters. Japanese Patent Application Laid-Open No. 2003-100604 discloses a method for obtaining substrate correction parameters and shot correction parameters, and an exposure apparatus employing it.

With respect to the method shown in Japanese Patent Application Laid-Open No. 2003-100604, in order to obtain shot correction parameters, dedicated sample shot regions are measured that are separate from the sample shot regions for obtaining substrate correction parameters. Consequently, a conventional exposure apparatus takes time for measurement of mark positions, and can be disadvantageous in terms of throughput.

SUMMARY OF THE INVENTION

The present invention provides, for example, a lithography apparatus which is advantageous in terms of overlay precision and throughput.

According to an aspect of the present invention, a lithography apparatus which forms a pattern on a substrate that includes a detector configured to detect a mark formed on the substrate; a controller configured to obtain a displacement amount of a position of the mark from a reference position thereof based on an output of the detector; wherein the controller is configured to obtain a representative value of, with respect to each of a plurality of marks associated with each sample shot region on the substrate, a plurality of the displacement amount respectively obtained based on outputs of the detector with respect to a plurality of the sample shot region, and obtain information relating to a form of a shot region on the substrate based on a plurality of the representative value respectively obtained with respect to the plurality of marks.

Further features of the present invention will become apparent from the following description of exemplary embodiments with reference to the attached drawings.

DESCRIPTION OF THE EMBODIMENTS

Hereinafter, preferred embodiments of the present invention will be described with reference to the drawings.
(First Embodiment)

Figure 1:
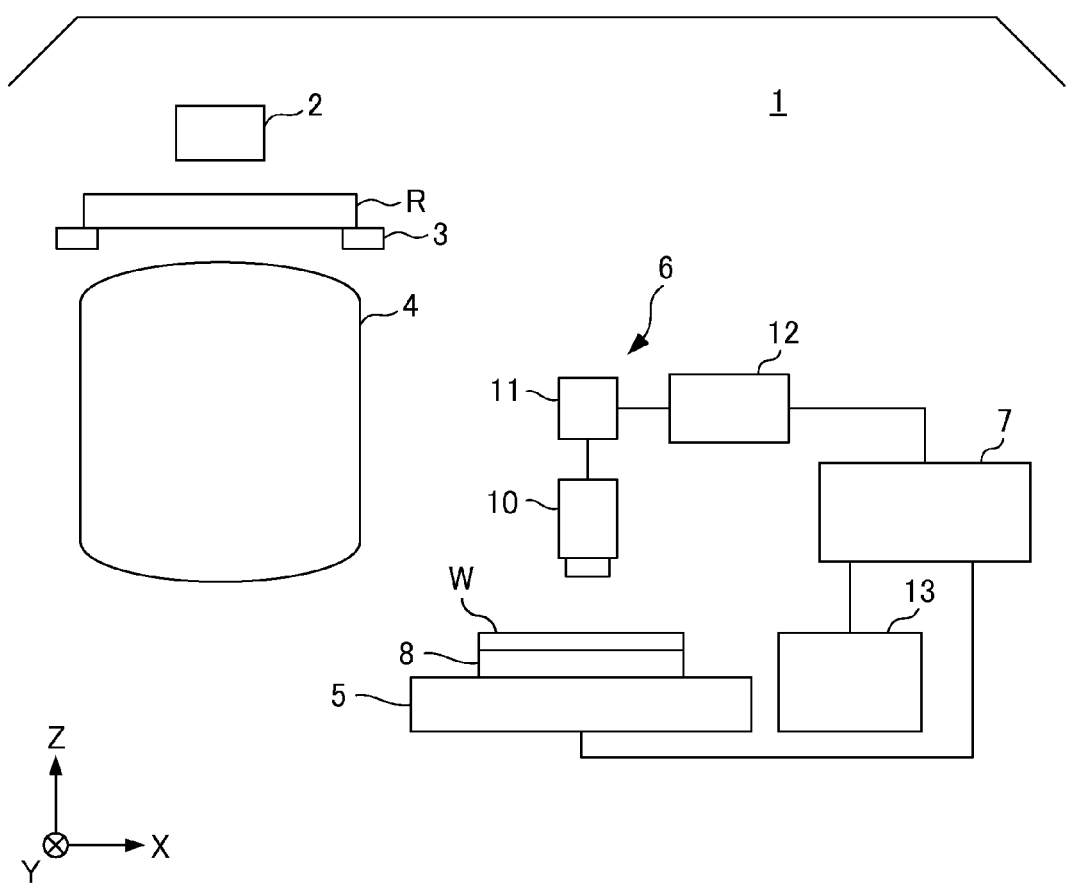
FIG. 1 is a drawing which shows a configuration of an exposure apparatus of a first embodiment of the present invention.

First, a description is given of a lithography apparatus (lithography method) of a first embodiment of the present invention. Hereinafter, the lithography apparatus of the present embodiment is described as an exposure apparatus for an example. FIG. 1 is a schematic view which shows a configuration of an exposure apparatus 1 of the present embodiment. An exposure apparatus 1 is exemplified as a projection exposure apparatus that is used in a manufacturing process of a semiconductor device, and that exposes (transfers) a pattern formed on a reticle R onto a wafer W (onto a substrate) by the step-and-repeat system. The exposure apparatus 1 is provided with an illumination system 2, a reticle stage 3 which hold the reticle R, a projection optical system 4, a wafer stage 5 which holds the wafer W, an alignment detection system 6, and a controller 7. Otherwise, in FIG. 1, the Z axis is parallel to the optical axis of the projection optical system 4 (the vertical direction in the present embodiment), the X axis is in the scanning direction of the wafer W during exposure in a vertical plane on the Z axis, and the Y axis is in a non-scanning direction that is orthogonal to the X axis.

The illumination system 2 regulates light that is radiated from a light source that is not illustrated in the drawing, and illuminates the reticle R. The reticle R is an original on which a pattern (e.g., a circuit pattern) to be transferred onto the wafer W is formed, and is, for example, made of vitreous silica. The reticle stage 3 is capable of moving in the respective axial directions of XY while holding the reticle R. The projection optical system 4 projects the image of a pattern on the reticle R that is irradiated with light from the illumination system 2 onto the wafer W at a prescribed magnification (e.g., ½ to ⅕). The wafer W is a substrate of which a resist (photosensitizer) is applied to the surface, and is composed of, for example, single crystal silicon. The wafer stage 5 is capable of moving in the respective axial directions of XYZ while holding the wafer W via a chuck 8.

The alignment detection system (detector) 6 detects positions (alignment positions) in the X axis direction and Y axis direction of the wafer W. For example, as shown in FIG. 1, it is possible to adopt a detection system which uses an off-axis method that optically detects reference marks on the wafer W without mediation by the projection optical system 4. The alignment detection system 6 includes a microscope 10, a CCD camera 11, and an image storage and operation device 12. The microscope 10 enlarges and observes the image of a pattern formed on the wafer W that is to be the object of alignment. The CCD camera 11 converts the pattern image obtained through the microscope 10 into electrical signals, and transmits them to the image storage and operation device 12 connected on the rear stage side. The image storage and operation device 12 performs a variety of image computation processing on the received image signals, stores the image signals and the computation processing results, and outputs them to the controller 7. The exposure apparatus 1 is further provided with a pre-alignment device 13 that serves to detect and adjust an approximate orientation of the wafer W from an outer shape reference of the wafer W, when the wafer W has been brought to an alignment detection position by a wafer carrying device that is not illustrated in the drawing.

The controller 7 is capable of performing operational control, arithmetic processing and the like with respect to the various components of the exposure apparatus 1. The controller 7 is, for example, composed of a computer or the like, is connected to the various components of the exposure apparatus 1 via circuit, and is capable of controlling the various components in accordance with a program or the like. The controller 7 may be integrally configured (in a shared casing) with other portion of the exposure apparatus 1, or it may be configured separately (in a separate casing) from other portion of the exposure apparatus 1.

Next, a description is given of operations of the exposure apparatus 1 in the present embodiment. Prior to conducting exposure, the exposure apparatus 1 carries out alignment using the alignment detection system 6 to achieve highly accurate overlay of a pattern formed on the reticle R onto a pre-existing pattern on the wafer W. Particularly in the present embodiment, the aforementioned AGA is adopted as a technique for obtaining an arrangement of shot regions that are multiply disposed on the wafer W. In this instance, for example, the following quantities are cited as wafer correction parameters (substrate correction parameters).

(1) Shift error of the central position of the wafer W (parallel translation): (Swx, Swy)

(2) Rotational error (rotational amount) of the wafer W (shot arrangement): (θwx, θwy)

(3) Magnification error (linear extension or contraction amount) of the wafer W (shot arrangement): (βwx, βwy)

A difference of the X-Y components of the rotational error of the wafer W (θwx−θwy) represents the degree of perpendicularity of the wafer W. As shot correction parameters, for example, the following quantities are cited.

(1) Rotational error (rotational amount) of the shot region: (θsx, θsy)

(2) Magnification error (linear extension or contraction amount) of the shot region: (βsx, βsy)

Figure 9A:
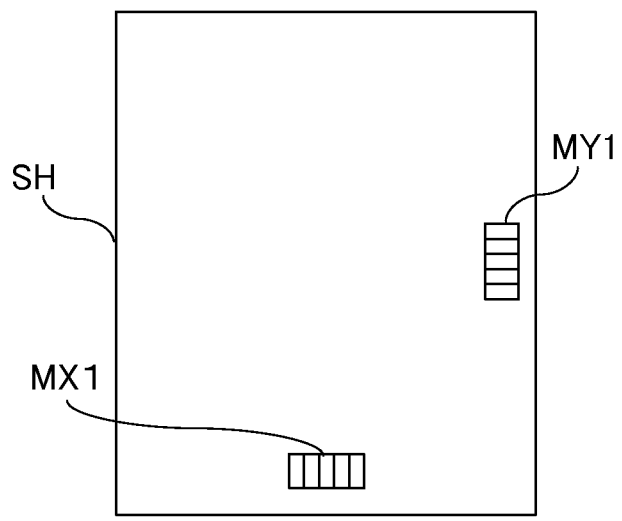
FIG. 9A is a drawing which shows an arrangement of marks related to shot regions SH that serve to obtain substrate correction parameters.
Figure 9B:
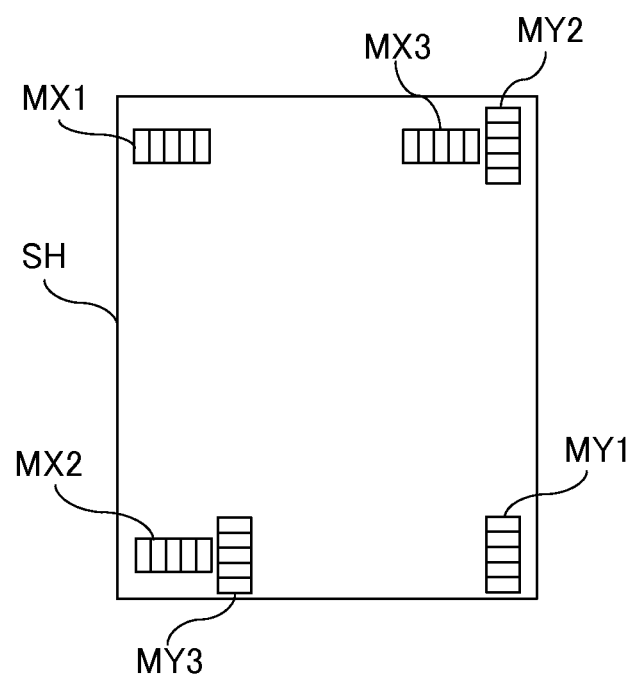
FIG. 9B is a drawing which shows an arrangement of marks related to shot regions SH that serve to obtain shot correction parameters.
Figure 10:
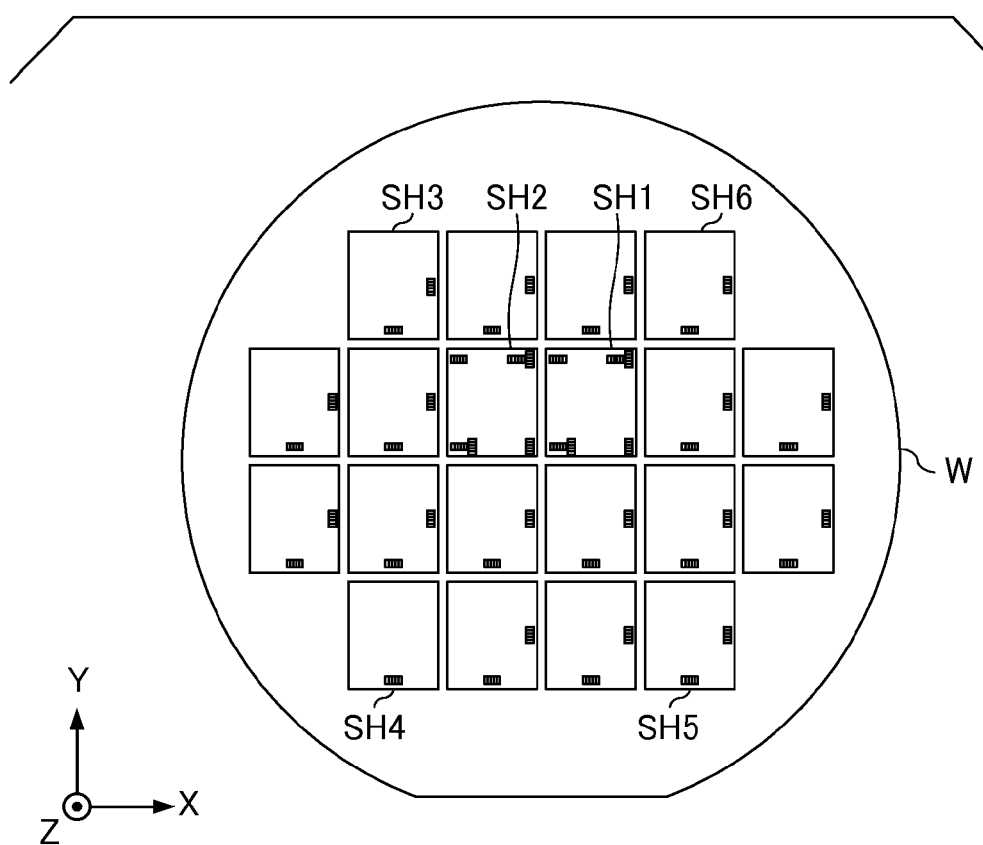
FIG. 10 is a drawing which shows an arrangement of sample shot regions on a conventional wafer.
Figure 11:
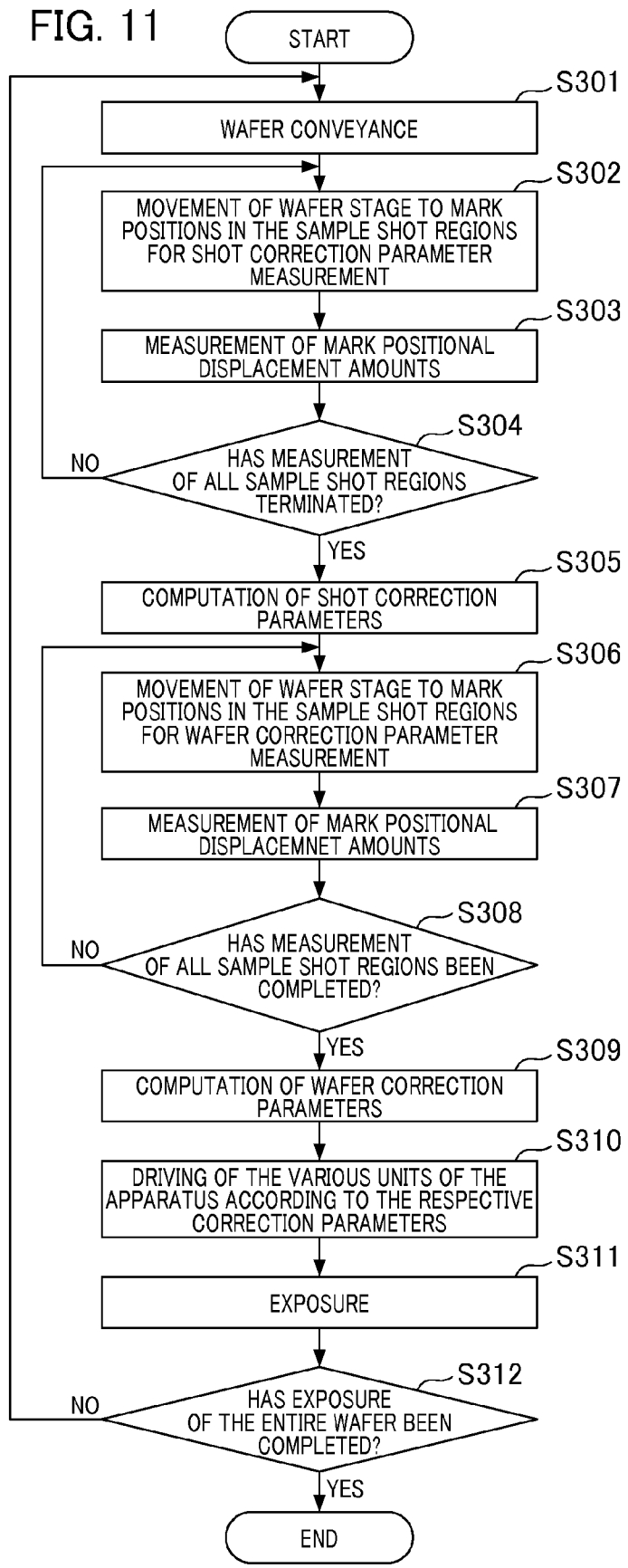
FIG. 11 is a flowchart which shows conventional processing steps.

As a comparative example to clarify features of the present embodiment, a description is given of a conventional processing flow including alignment processing when this AGA is adopted. FIG. 11 is a flowchart which shows conventional processing steps. Multiple shot regions SH (including sample shot regions SH1 and SH2 for shot correction parameter measurement, and sample shot regions SH3 to SH6 for wafer correction parameter measurement) described using FIG. 9 and FIG. 10 are disposed on the wafer W. For convenience, the various components of the conventional exposure apparatus described herein are assigned the same reference symbols as the exposure apparatus 1 of the present embodiment shown in FIG. 1. First, a controller 7 conveys a wafer W to be processed into an exposure apparatus 1 by a wafer carrying device (not illustrated in the drawing) (step S301). Here, after the controller 7 causes the pre-alignment device 13 to roughly align the wafer W, it conveys this wafer W onto a wafer stage 5, where it is held by vacuum adsorption of a chuck 8.

Next, the controller 7 obtains shot correction parameters by a series of steps S302-S305. First, the controller 7 moves the wafer stage 5 so that a mark (alignment mark) MX1 formed in a first sample shot region for shot correction parameter measurement SH1 enters a view field range of the microscope 10 of the alignment detection system 6 (step S302). Next, the controller 7 causes the alignment detection system 6 to detect a positional displacement of the mark MX1, and measures a positional displacement amount as positional information (step S303). Next, the controller 7 judges whether measurement of positional displacement amounts with respect to all sample shot regions SH1 and SH2 for shot correction parameter measurement on the wafer W has been completed by the alignment detection system 6 (step S304). Here, in the case where the controller 7 judges that there is an unmeasured sample shot region (NO), a return to step S302 occurs. On the other hand, in the case where it is judged that measurement of all sample shot regions has been completed (YES), the processing advances to the next step S305. The controller 7 then computes the shot correction parameters (step S305).

Next, the controller 7 obtains wafer correction parameters by a series of steps (AGA steps) S306-S309. First, the controller 7 moves the wafer stage 5 so that a mark MX1 formed in a first sample shot region SH3 for wafer correction parameter measurement enters the visual field range of the microscope 10 of the alignment detection system 6 (step S306). Next, the controller 7 causes the alignment detection system 6 to measure a positional displacement amount as positional information of the mark MX1 (step S307). Next, the controller 7 judges whether measurement of positional displacement amounts with respect to all sample shot regions SH3-SH6 for wafer correction parameter measurement on the wafer W has been completed by the alignment detection system 6 (step S308). Here, in the case where the controller 7 judges that there is an unmeasured sample shot region (NO), a return to step S306 occurs. On the other hand, in the case where it is judged that measurement of all sample shot regions has been completed (YES), the processing advances to the next step S309. The controller 7 then computes the wafer correction parameters (step S309).

Next, the controller 7 corrects the pattern formation position based on the obtained shot correction parameters and wafer correction parameters, i.e., it drives the respective units of the exposure apparatus 1 so as to reduce errors in the shot arrangement and the shot form (step S310). Subsequently, the controller 7 carries out exposure (exposure step: step S311). The controller 7 then judges whether exposure has been completed with respect to the entirety of the wafer W to be exposed (step S312). Here, in the case where the controller 7 judges that exposure is not completed (NO), a return to step S301 occurs where the processing is repeated, and in the case where it is judged to be complete (YES), all processing is terminated.

According to these conventional alignment operations, by suitably correcting a shot arrangement and a shot form, it is possible to conduct exposure of the various shot regions based on highly accurate overlay. However, as described using FIG. 9 to FIG. 11, conventionally, the sample shot regions for obtainment of shot correction parameters, and the sample shot regions for obtainment of wafer correction parameters are respectively dedicated shot regions. The operations which detect marks to be detected existing on these sample shot regions, and which measure positional displacement amounts based on the detection results are also respectively separate operations. Particularly with respect to the sample shot regions for obtaining shot correction parameters, as multiple marks are detected within a single sample shot region, the number of marks that must be detected in order to increase overlay precision is necessarily large. That is, with a conventional exposure apparatus, the procedure for increasing overlay precision may cause a decline in throughput. In the present embodiment, as described below, multiple marks are formed in advance in shot regions SH on the wafer W, these marks are detected, and shot correction parameters and wafer correction parameters are obtained for use in correction.

Figure 2:
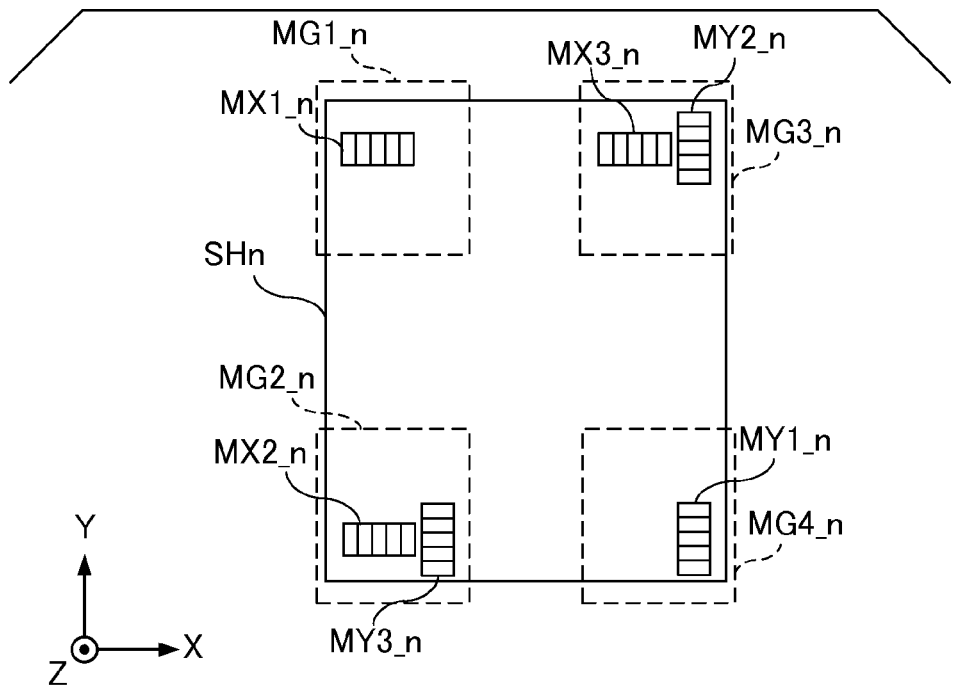
FIG. 2 is a drawing which shows an arrangement of marks inside a shot region of the first embodiment.

FIG. 2 is a schematic plan view which shows an arrangement of marks formed in a shot region (a shot region SHn of number n) on a wafer W to be exposed in the present embodiment. In shot region SHn, marks are respectively arranged in each mark region MG1_n, MG2_n, MG3_n, and MG4_n corresponding to the four corners of the surface. In this example, first, a mark MX1_n in the X axis direction is formed in the first mark region MG1_n. A mark MX2_n in the X axis direction and a mark MY3_n in the Y axis direction are formed in the second mark region MG2_n. A mark MX3_n in the X axis direction and a mark MY2_n in the Y axis direction are formed in the third mark region MG3_n. A mark MY1_n in the Y axis direction is formed in the fourth mark region MG4_n.

Figure 3:
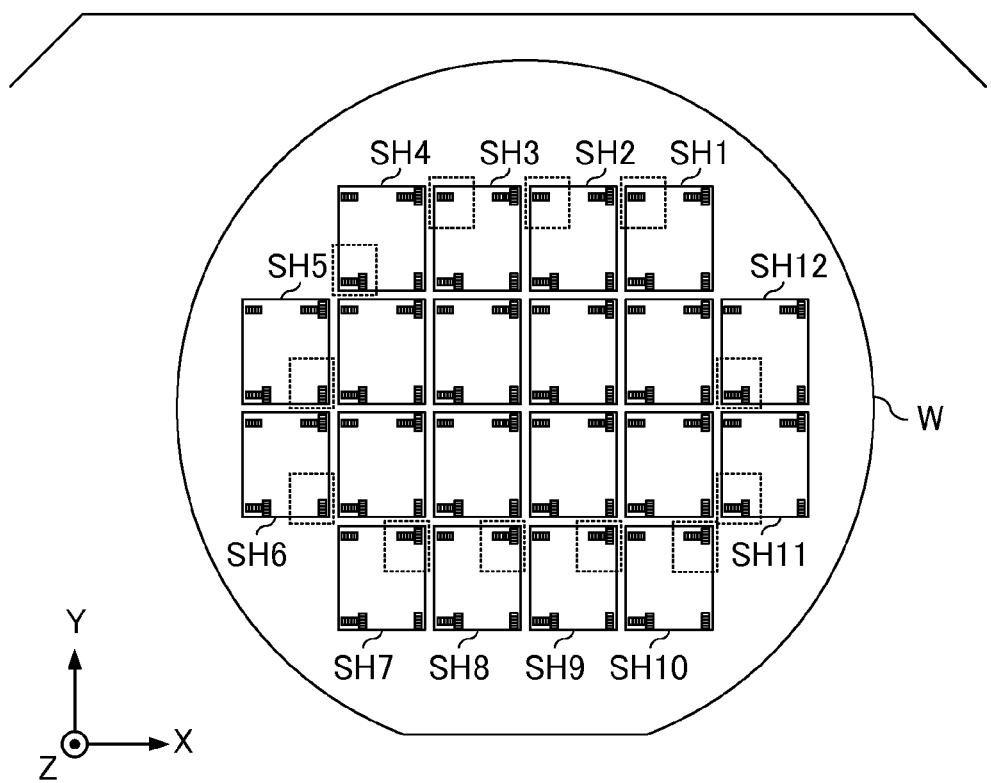
FIG. 3 is a drawing which shows marks that are detection objects in the first embodiment.

FIG. 3 is a schematic plan view which shows a sequence (arrangement) of shot regions SHn on a wafer W in the present embodiment. In the present embodiment, for example, among all shot regions SH, the shot regions existing at the periphery of the wafer W may be arranged (determined) as sample shot regions SH1-SH12. In contrast to the conventional case shown in FIG. 10, in the present embodiment, the sample shot regions are not divided for shot correction parameter measurement use and for wafer correction parameter measurement use, and the same marks shown in FIG. 2 are formed in all of the shot regions SH on the wafer W.

Figure 4:
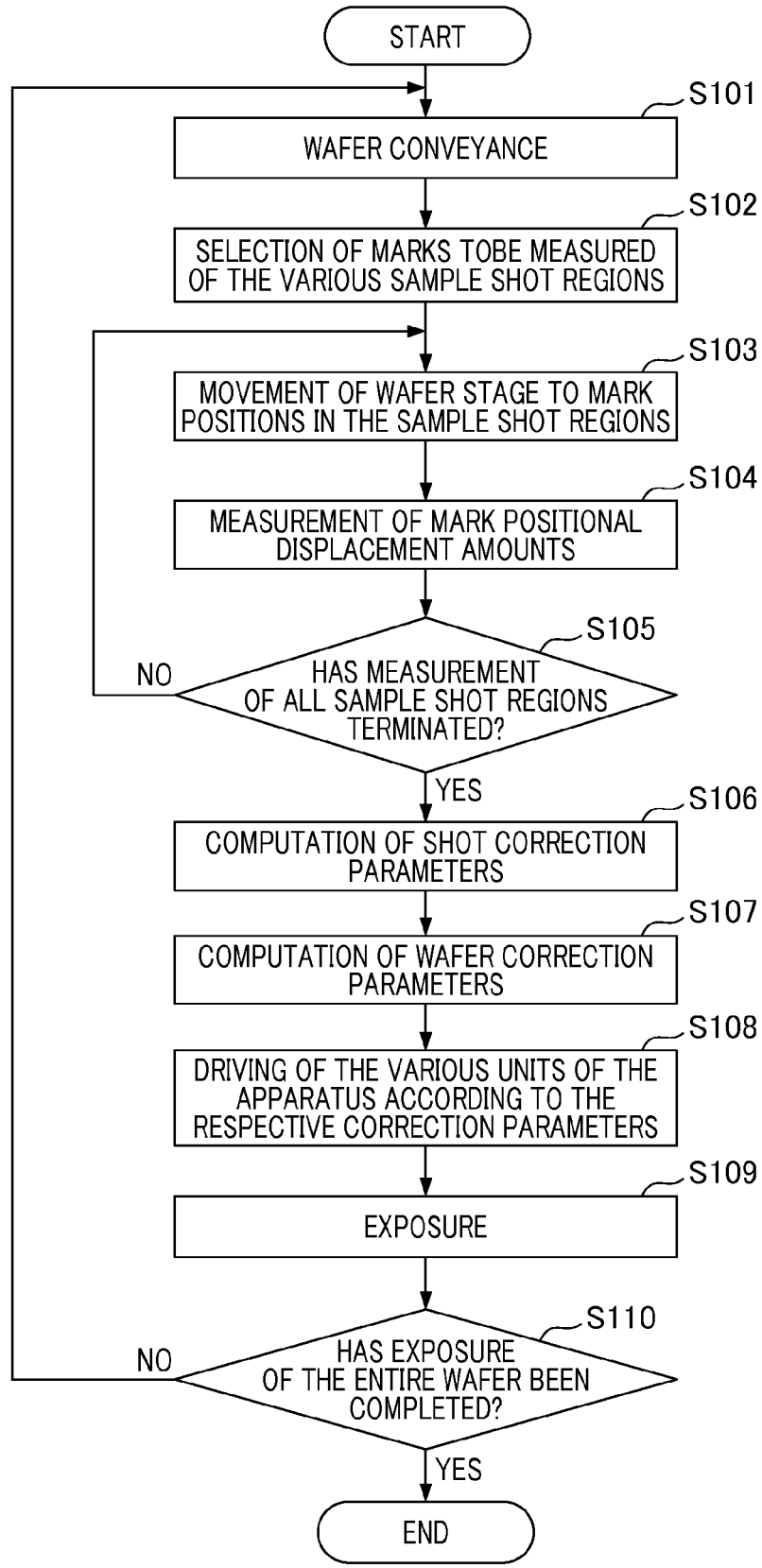
FIG. 4 is a flowchart which shows processing steps in the first embodiment.

FIG. 4 is a flowchart pertaining to the present embodiment, which shows processing steps relative to a wafer W wherein the aforementioned shot regions (sample shot regions) SHn are set. First, the controller 7 conveys the wafer W to be processed into the exposure apparatus 1 by a wafer carrying device that is not illustrated in the drawing (step S101). Here, after the controller 7 causes the pre-alignment device 13 to roughly align the wafer W, this wafer W is conveyed onto the wafer stage 5, and is held by vacuum adsorption of the chuck 8.

Next, the controller 7 selects marks to be detected for each sample shot region SH1-SH12 on the wafer W (step S102). At this time, the controller 7 selects marks so that at least one mark is selected for each coordinate among all the selected marks. As a specific example, as shown in FIG. 3, first, in sample shot regions SH1, SH2, and SH3, the marks respectively disposed in mark regions MG1_1, MG1_2, and MG1_3 are selected. In sample shot regions SH4, SH11, and SH12, the marks respectively disposed in mark regions MG2_4, MG2_11, and MG2_12 are selected. In sample shot regions SH7, SH8, SH9, and SH10, the marks respectively disposed in mark regions MG3_7, MG3_8, MG3_9, and MG3_10 are selected. In sample shot regions SH5, and SH6, the marks respectively disposed in mark regions MG4_5 and MG4_6 are selected.

Figure 5:
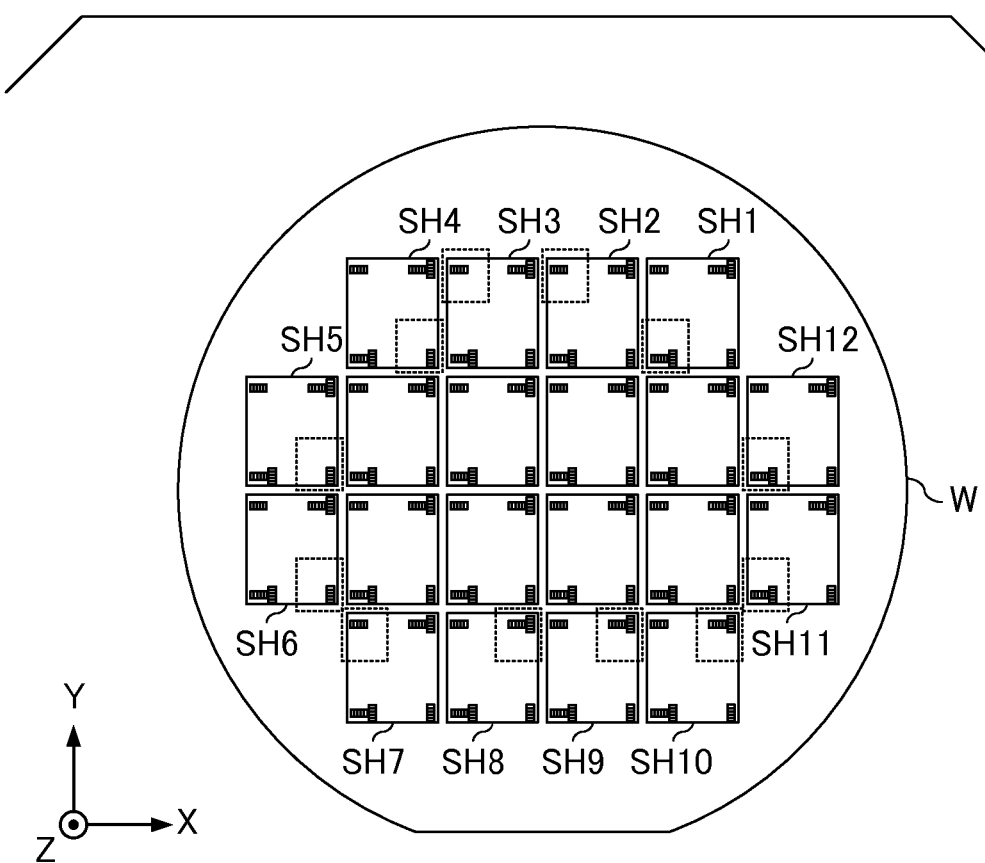
FIG. 5 is a drawing which shows another example of marks that are detection objects in the first embodiment.

FIG. 5 is a schematic plan view which shows another mark selection example in step S102. Instead of the aforementioned selection example, as shown in FIG. 5, the controller 7 may also select marks so that the number of marks selected for each coordinate is uniform among all the selected marks. By selecting marks in this manner, it can be expected that the irregularities of the displacement amounts of the respective marks will be identical, and that overlay will be more reliably conducted. Otherwise, apart from these examples, selection may be conducted at one's discretion, provided that the condition is met that at least one mark is selected for each coordinate taking into account the arrangement of sample shot regions and the arrangement of marks within the shot region.

Next, returning to FIG. 4, the controller 7 moves the wafer stage 5 so that the mark MX1_1 selected in the first sample shot region SH1 enters into the visual field range of the microscope 10 of the alignment detection system 6 (step S103).

Next, the controller 7 causes the alignment detection system 6 to detect a positional displacement of the mark MX1_1, and measures a positional displacement amount as positional information (step S104). As a method for detecting positional displacement at this time, for example, the microscope 10 and the CCD camera 11 take in the mark MX1_1 illuminated by an alignment illumination device that is not illustrated in the drawings as an image signal. The image storage and operation device 12 then obtains a displacement amount lx1_1 from the design position of the mark MX1_1 by collating by means of pattern matching of the inputted image signal and a mark pattern that is stored internally in advance.

Next, the controller 7 judges whether measurement of positional displacement amount by the alignment detection system 6 has been completed with respect to all sample shot regions SH1-SH12 on the wafer W (step S105). Here, in the case where the controller 7 judges that there is an unmeasured sample shot region SH (NO), a return to step S103 occurs. On the other hand, in the case where it is judged that measurement of all sample shot regions SH has been completed (YES), a transition to the next step S106 occurs. In the present embodiment, the marks that has been detected in all the sample shot regions SH1-SH12 in the operations to this point are as follows: MX1_2, MX1_3, MX2_4, MY3_4, MY1_5, MY1_6, MX3_7, MY2_7, MX3_8, MY2_8, MX3_9, MY2_9, MX3_10, MY2_10, MX2_11, MY3_11, MX2_12, MY3_12. By detecting these marks, the controller 7 then measures the following positional displacements amounts in the X and Y axis directions: lx1_2, lx1_3, lx2_4, ly3_4, ly1_5, ly1_6, lx3_7, ly2_7, lx3_8, ly2_8, lx3_9, ly2_9, lx3_10, ly2_10, lx2_11, ly3_11, lx2_12, ly3_12.

Next, the controller 7 computes shot correction parameters (step S106). Here, the controller 7 computes shot correction parameters by statistically processing the positional displacement amounts of the various marks measured in the operations until step S105. For example, by computing average values for the various marks arranged at each coordinate, the controller 7 is ultimately able to compute a shot correction parameter. A specific example is as follows. First, the number of the selected mark MXn, MYn is mxn, myn, and the number of the sample shot region SH in which the mark MXn, MYn is selected is (axn_1, axn_2, . . . axn_mxn), (ayn_1, ayn_2, . . . ayn_myn). In this case, average positional displacement amounts in the X and Y axis directions of each mark (lxn' and lyn') are represented by Formula 1.

$$\begin{pmatrix} lxn' \\ lyn' \end{pmatrix} = \begin{pmatrix} \dfrac{lxaxn\_1 + lxaxn\_2 + \ldots + lxaxn\_mxn}{mxn} \\ \dfrac{lxayn\_1 + lxayn\_2 + \ldots + lxayn\_myn}{myn} \end{pmatrix} \quad \text{[Formula 1]}$$

$$= \begin{pmatrix} \dfrac{\sum_{z=1}^{mxn} lxaxn\_z}{mxn} \\ \dfrac{\sum_{z=1}^{myn} lxayn\_z}{myn} \end{pmatrix}$$

Here, (lxn' and lyn') are represented by Formula 2 when n corresponding to the number of marks is n=1 to 3.

$$\begin{pmatrix} lx1' \\ ly1' \end{pmatrix} = \begin{pmatrix} \dfrac{lx1\_1 + lx1\_2 + lx1\_3}{3} \\ \dfrac{ly1\_5 + ly1\_6}{2} \end{pmatrix} \quad \text{[Formula 2]}$$

$$\begin{pmatrix} lx2' \\ ly2' \end{pmatrix} = \begin{pmatrix} \dfrac{lx2\_4 + lx2\_11 + lx2\_12}{3} \\ \dfrac{ly2\_7 + ly2\_8 + ly2\_9 + ly2\_10}{4} \end{pmatrix}$$

$$\begin{pmatrix} lx3' \\ ly3' \end{pmatrix} = \begin{pmatrix} \dfrac{lx3\_7 + lx3\_8 + lx3\_9 + lx3\_10}{4} \\ \dfrac{ly3\_4 + ly3\_11 + ly3\_12}{3} \end{pmatrix}$$

Also, a residual correction error V is represented by Formula 3 when the aforementioned positional displacement amounts lxn' and lyn' are used.

$$V = \dfrac{1}{m}\sum_{n=1}^{m}\left|\begin{pmatrix} dxn \\ dyn \end{pmatrix} + \begin{pmatrix} lxn' \\ lyn' \end{pmatrix} - \begin{pmatrix} dxn' \\ dyn' \end{pmatrix}\right|^2 \quad \text{[Formula 3]}$$

$$= \dfrac{1}{m}\sum_{n=1}^{m}\left|\begin{pmatrix} lxn' \\ lyn' \end{pmatrix} - \begin{bmatrix} \beta sx & -\theta sy \\ \theta sx & \beta sy \end{bmatrix}\begin{pmatrix} dxn \\ dyn \end{pmatrix} + \begin{pmatrix} Ssx \\ Ssy \end{pmatrix}\right|^2$$

Here, as lxn' and lyn' and design values dxn and dyn are known, the controller 7 should obtain (Ssx, Ssy, θsx, θsy, βsx, βsy) by solving the simultaneous equation that minimizes the residual correction error V.

Next, the controller 7 computes the wafer correction parameters (step S107). At this time, the controller 7 computes the wafer correction parameters based on the positional displacement amounts of the respective marks measured in the operations until step S105. A specific example is as follows. First, the displacement amount (Lxk, Lyk) (hereinafter, k=1 to 12: corresponding to the number of the sample shot region SH) from the design value of the reference position of each sample shot region SH (ordinarily, the center position of the shot region) is respectively obtained. For example, the actual mark positions should be coordinates obtained by adding the positional displacement amounts (lxn', lyn') of marks measured to the design position of the respective mark from the center position of the respective sample shot region SH, and these should be averaged. The design position of the center of each sample shot region SH existing within the wafer W is represented by (Dxk, Dyk). The shot region center position (Dxk', Dyk') corrected by the wafer correction parameters is then represented by Formula 4.

$$\begin{pmatrix} Dxk' \\ Dyk' \end{pmatrix} = \begin{bmatrix} 1+\beta wx & -\theta wy \\ \theta wx & 1+\beta wy \end{bmatrix} \begin{pmatrix} Dxk \\ Dyk \end{pmatrix} + \begin{pmatrix} Swk \\ Swk \end{pmatrix} \quad \text{[Formula 4]}$$

The actual shot region center position obtained from measurement results is represented by Formula 5.

$$\begin{pmatrix} Dxk \\ Dyk \end{pmatrix} + \begin{pmatrix} Lxk \\ Lyk \end{pmatrix} \quad \text{[Formula 5]}$$

Also, the residual correction error V' is represented by Formula 6 when the aforementioned shot region center position Dxk', Dyk' is used.

$$V' = \frac{1}{m} \sum_{k=1}^{m} \left| \begin{pmatrix} Dxk \\ Dyk \end{pmatrix} + \begin{pmatrix} Lxk \\ Lyk \end{pmatrix} - \begin{pmatrix} Dxk' \\ Dyk' \end{pmatrix} \right|^2 \quad \text{[Formula 6]}$$

$$= \frac{1}{m} \sum_{k=1}^{m} \left| \begin{pmatrix} Lxk \\ Lyk \end{pmatrix} - \begin{bmatrix} \beta wx & -\theta wy \\ \theta wx & \beta wy \end{bmatrix} \begin{pmatrix} Dxk \\ Dyk \end{pmatrix} + \begin{pmatrix} Swx \\ Swy \end{pmatrix} \right|^2$$

Here, as Lxk and Lyk and design values Dxk and Dyk are known, the controller 7 should obtain {Swx, Swy, θwx, θwy, βwx, βwy} by solving the simultaneous equation that minimizes the residual correction error V'.

The following operations from step S108 to S110 are then identical to the conventional operations from step S310 to S312 in FIG. 11.

In this manner, the exposure apparatus 1 is able to conduct exposure of the various shot regions with a high degree of overlay precision in conjunction with shot sequences and shot forms that are corrected using shot correction parameters and wafer correction parameters. Furthermore, in contrast to a conventional exposure apparatus, the exposure apparatus 1 does not distinguish between sample shot regions for obtaining shot correction parameters and sample shot regions for obtaining wafer correction parameters, and marks are formed that are common to all of the sample shot regions SH. Even when obtaining shot correction parameters, there is no need for the exposure apparatus 1 to measure all of the marks in the sample shot regions SH. Therefore, as the number of marks to be detected is decreased compared to a conventional exposure apparatus, alignment can be conducted at high speed, and throughput can be improved as a consequence.

As described above, according to the present embodiment, it is possible to provide a lithography apparatus and a lithography method that are advantageous for improving throughput, without reducing overlay precision.

In the present embodiment, although processing of obtaining a mean value (average value) is used for statistical processing for the positional displacement amounts of each mark over a plurality of sample shot regions, another statistical processing for obtaining a representative value may be used. For example, a median (value), mode (value) or the like may be used instead of the mean (value).

(Second Embodiment)

Next, a lithography apparatus of a second embodiment of the present invention is described. When measuring the positional displacement amounts of the marks in the first embodiment, the exposure apparatus 1 serving as the lithography apparatus carries out so-called step measurement in which the wafer W on which the marks are formed is put in a stationary state. In contrast, the characteristic of the lithography apparatus of the present embodiment is that it carries out so-called scanning measurement in which the positional displacement amounts of the marks are measured while the wafer W is moved (scanned) relative to the alignment detection system 6. In the present embodiment described below, the lithography apparatus is exemplified as an exposure apparatus, and the configuration of the exposure apparatus is also identical to that of the exposure apparatus 1 of the first embodiment.

Figure 6:
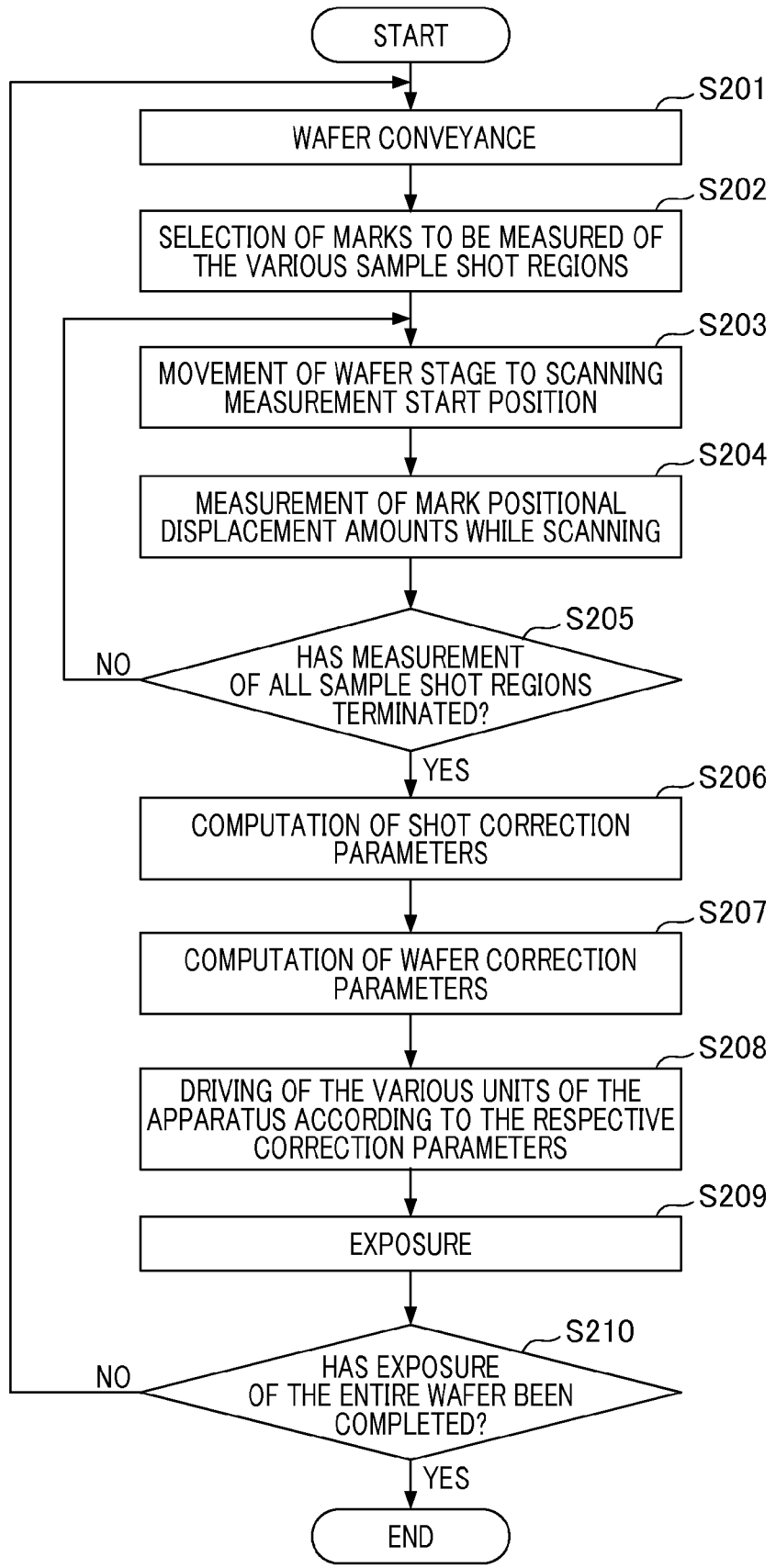
FIG. 6 is a flowchart which shows processing steps in a second embodiment.

FIG. 6 is a flowchart which shows processing operations of the present embodiment, for example, with respect to a wafer W on which shot regions (sample shot regions) SHn shown in FIG. 2 that are identical to those of the first embodiment are set. First, the controller 7 conveys the wafer W into the exposure apparatus 1 in the same manner as step S101 of FIG. 4 of the first embodiment (step S201).

Figure 7:
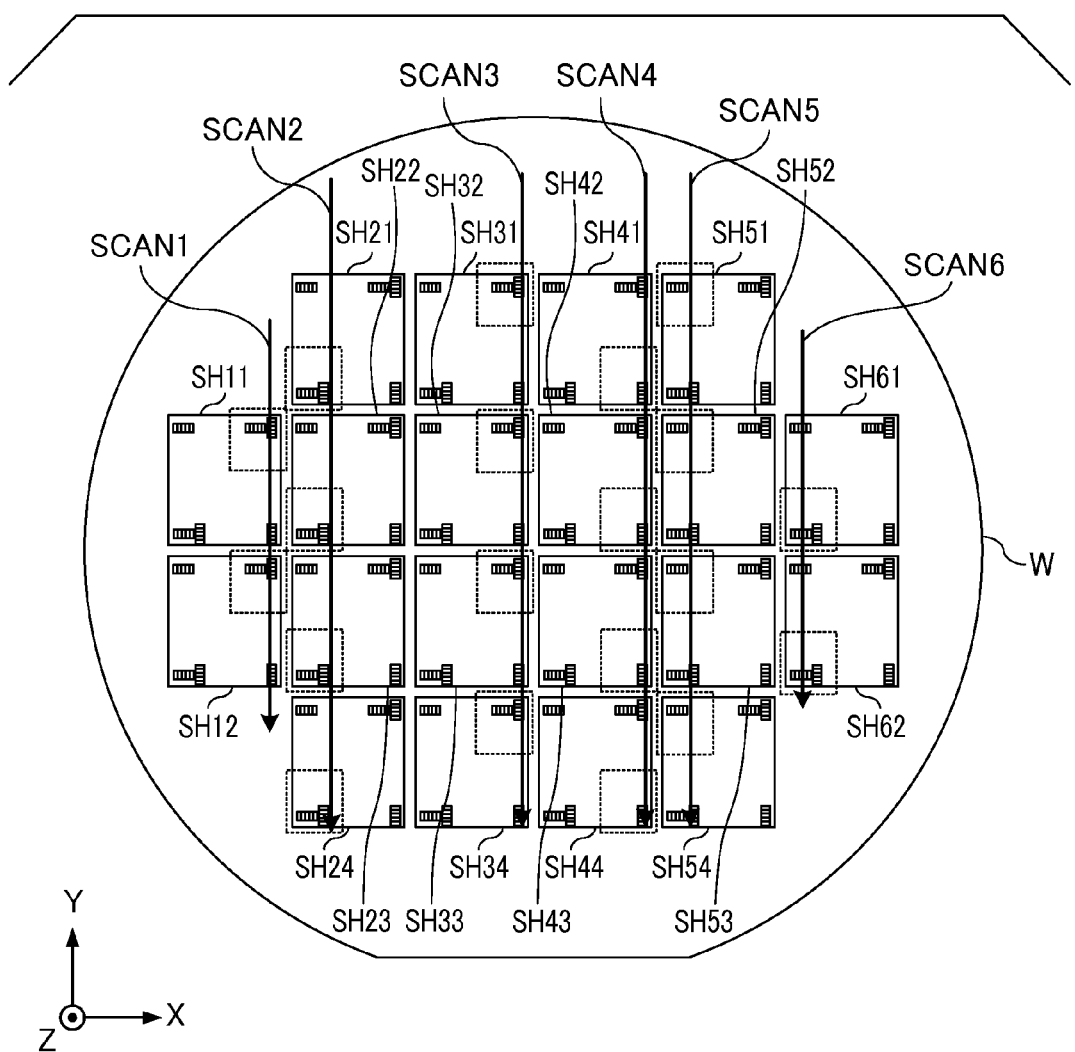
FIG. 7 is a drawing which shows marks that are detection objects in the second embodiment.

Next, the controller 7 selects marks to be detected for each sample shot region SH1-SH12 on the wafer W (step S202). At this time, the controller 7 selects marks so that at least one mark is selected for each coordinate among all the selected marks, in the same manner as step S102 of the first embodiment. FIG. 7 is a schematic plan view which shows a sequence (arrangement) of shot regions SHn on the wafer W in the present embodiment. Scanning measurement is conducted in the present embodiment, with the result that all sample shot regions SH on the wafer W can be treated as sample shot regions SH11-SH62 so as to conduct alignment in the Y axis direction that is the direction of scanning. In the present embodiment, in contrast to the conventional art shown in FIG. 10, the sample shot regions are not divided into those for shot correction parameter measurement and those for wafer correction parameter measurement, and the marks shown in FIG. 2 are formed in all of the shot regions SH. As specific examples of selection, as shown in FIG. 7, first, the marks respectively disposed in mark regions MG3_11 and MG3_12 are selected in sample shot regions SH11 and SH12 that are measured in a first scan SCAN1. The marks respectively disposed in mark regions MG2_21, MG2_22, MG2_23, and MG2_24 are selected in sample shot regions SH21, SH22, SH23, and SH24 that are measured in a second scan SCAN2. The marks respectively disposed in mark regions MG3_31, MG3_32, MG3_33, and MG3_34 are selected in sample shot regions SH31, SH32, SH33, and SH34 that are measured in a third scan SCAN3. The marks respectively disposed in mark regions MG4_41, MG4_42, MG4_43, and MG4_44 are selected in sample shot regions SH41, SH42, SH43, and SH44 that are measured in a fourth scan SCAN4. The marks respectively disposed in mark regions MG1_51, MG1_52, MG5_53, and MG5_54 are selected in sample shot regions SH51, SH52, SH53, and SH54 that are measured in a fifth scan SCAN5. The marks respectively disposed in mark regions MG2_61 and MG2_62 are selected in sample shot regions SH61 and SH62 that are measured in a sixth scan SCAN6.

Figure 8:
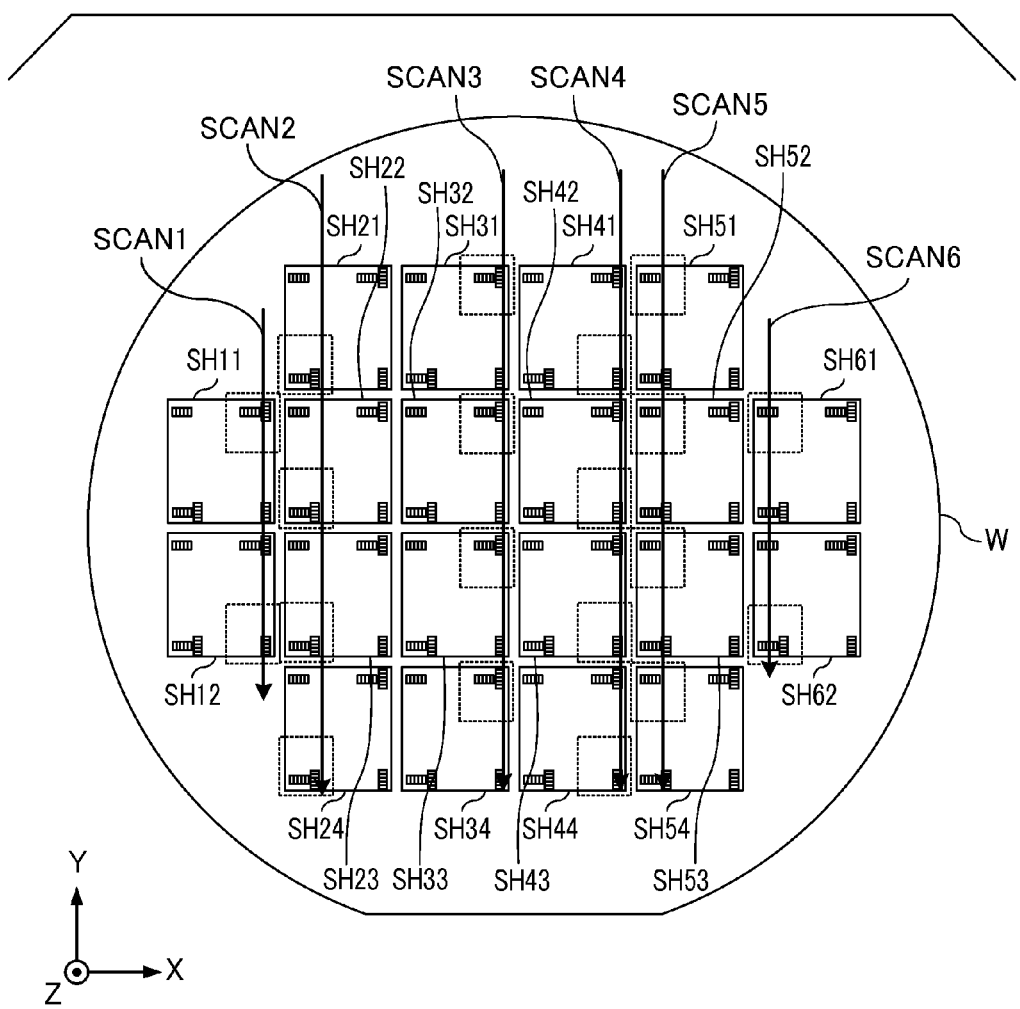
FIG. 8 is a drawing which shows another example of marks that are detection objects in the second embodiment.

FIG. 8 is a schematic plan view which shows another example of mark selection in step S202. In the present embodiment, as described using FIG. 5 in the first embodiment, instead of the foregoing selection example, the controller 7 may also select marks so that the number of marks selected for each coordinate is uniform among all selected marks, as shown in FIG. 8. Furthermore, in this case, as well, apart from this, selection may be conducted at one's discretion provided that at least one mark is selected for each coordinate taking into account the arrangement of sample shot regions and the arrangement of marks in the shot regions.

Returning to FIG. 6, next, the controller 7 moves the wafer stage 5 to the starting position of the first scan SCAN1 (step S203). Next, the controller 7 causes the alignment detection system 6 to detect the positional displacements of each mark, and measures the positional displacement amounts (step S204). As a method for detecting positional displacement at this time, first, the controller 7 moves the wafer stage 5 in the Y axis direction. During movement thereof, when the marks selected in step S202 sequentially enter the visual field range of the microscope 10 and the CCD camera 11 in the alignment detection system 6, the controller 7 takes in the respective marks that are illuminated by the alignment illumination device that is not illustrated in the drawings as image signals. The controller 7 then carries out pattern matching to collate the image signals taken in by the image storage and operation device 12 with the pattern of marks that is internally stored in advance. By this means, the displacement amounts lx1_11 and lx1_12 are obtained from the design positions of the marks MX1_11 and MX1_12 imaged in the first scan SCAN1.

Next, the controller 7 judges whether the alignment detection system 6 has measured the positional displacement amounts of all of the sample shot regions SH11-SH62 on the wafer W (step S205). Here, in the case where the controller 7 judges that there are unmeasured sample shot regions (NO), a return to step S203 occurs. On the other hand, in the case where it is judged that measurement of all sample shot regions has been carried out (YES), a transition to the next step S206 occurs. The operations of the following steps S206 to S210 are identical to the operations from step S106 to S110 in FIG. 4 of the first embodiment. In particular, in the operation in which shot correction parameters are computed in step S206, the respective positional displacement amounts obtained until step S205 are computed by statistical processing in the same manner as the first embodiment.

In this manner, according to the present embodiment, as the same effects are obtained as in the first embodiment, and particularly as the positional displacement amounts of marks are measured by scanning measurement, it is possible to measure a large number of marks in a shorter time, thereby enabling further improvement of throughput.

In each of the foregoing embodiments, the shot correction parameters assumed a rotational amount and a magnification, but one is not limited thereto. For example, by measuring a larger number of marks within the shot regions, it is possible to obtain shot region distortions such as trapezoidal distortion, barrel distortion, and pincushion distortion, and use these as the shot correction parameters. With respect to these shot correction parameters, as well, it is then also acceptable to suitably increase the mark coordinates within the shot region that are measured.

In each of the foregoing embodiments, an example of an exposure apparatus was described as the lithography apparatus, but the lithography apparatus is not limited thereto, and other lithography apparatuses are also acceptable. For example, a drawing apparatus wherein a substrate (a photosensitizer atop it) is drawn upon with charged particle radiation such as electron beams is also acceptable, or an imprint apparatus wherein a pattern is formed on a substrate by forming (molding) an imprint material on a substrate with a mold is also acceptable.

(Article Manufacturing Method)

An article manufacturing method according to an embodiment of the present invention is preferred in manufacturing an article such as a micro device such as a semiconductor device or the like, an element or the like having a microstructure, or the like. The article manufacturing method may include a step of forming a pattern (e.g., latent image pattern) on an object (e.g., substrate on which a photosensitive material is coated) using the aforementioned lithography apparatus; and a step of processing (e.g., step of developing) the object on which the latent image pattern has been formed in the previous step. Furthermore, the article manufacturing method may include other known steps (oxidizing, film forming, vapor depositing, doping, flattening, etching, resist peeling, dicing, bonding, packaging, and the like). The device manufacturing method of this embodiment has an advantage, as compared with a conventional device manufacturing method, in at least one of performance, quality, productivity and production cost of a device.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2013-150721 filed Jul. 19, 2013, which is hereby incorporated by reference herein in its entirety.

What is claimed is:

1. A lithography apparatus which forms a pattern on a substrate, the apparatus comprising:
    a detector configured to detect a mark formed on the substrate;
    a controller configured to obtain a displacement amount of a position of the detected mark from a reference position thereof based on an output of the detector;
    wherein the controller is configured to obtain information relating to a position of a shot region on the substrate based on a plurality of ones of the displacement amount respectively obtained based on outputs of the detector with respect to a plurality of ones of the shot region, and obtain, from the plurality of ones the displacement amount, a representative value of, with respect to each of a plurality of ones of the mark associated with a shot region on the substrate, a plurality of ones of the displacement amount respectively obtained with respect to a plurality of ones of the shot region, and obtain information relating to a rotation of the shot region on the substrate based on a plurality of ones of the representative value respectively obtained with respect to the plurality of ones of the mark.

2. The apparatus according to claim 1, wherein the controller is configured to obtain, as the representative value, a mean, median or mode.

3. The apparatus according to claim 1, wherein the controller is configured to select marks to be detected by the detector so that respective numbers of the selected marks with respect to the plurality of ones of the shot region are mutually equal.

4. The lithography apparatus according to claim 1, wherein the controller is configured to cause the detector to detect a mark in a state where the detector and the substrate are moved relatively.

5. The lithography apparatus according to claim 3, wherein the controller is configured to select marks to be detected by the detector so that the selected marks are aligned in a direction in which the detector and the substrate are moved relatively.

6. A lithography method of detecting a mark formed on a substrate, obtaining a displacement amount of a position of the detected mark from a reference position thereof based on the detected mark, and forming a pattern on the substrate based on the obtained displacement amount, the method comprising steps of:
obtaining information relating to a position of a shot region on the substrate based on a plurality of ones of the displacement amount respectively obtained with respect to a plurality of ones of the shot region;
obtaining, from the plurality of ones of the displacement amount, a representative value of, with respect to each of a plurality of ones of the mark associated with a shot region on the substrate, a plurality of ones of the displacement amount respectively obtained with respect to a plurality of ones of the shot regions; and
obtaining information relating to a form rotation of a shot region on the substrate based on a plurality of ones of the representative values respectively obtained with respect to the plurality of ones of the mark.

7. A method of manufacturing an article, the method comprising steps of:
forming a pattern on a substrate using a lithography apparatus; and
processing the substrate, on which the pattern has been formed, to manufacture the article,
wherein the lithography apparatus includes:
a detector configured to detect a mark formed on the substrate;
a controller configured to obtain a displacement amount of a position of the detected mark from a reference position thereof based on an output of the detector;
wherein the controller is configured to obtain information relating to a position of a shot region on the substrate based on a plurality of ones of the displacement amount respectively obtained based on outputs of the detector with respect to a plurality of ones of the shot region, and obtain, from the plurality of ones of the displacement amount, a representative value of, with respect to each of a plurality of ones of the mark associated with a shot region on the substrate, a plurality of ones of the displacement amount respectively obtained with respect to a plurality of ones of the shot region, and obtain information relating to a form rotation of a shot region on the substrate based on a plurality of ones of the representative value respectively obtained with respect to the plurality of ones of the mark.

8. A lithography apparatus which forms a pattern on a substrate, the apparatus comprising:
a detector configured to detect a mark formed on the substrate;
a controller configured to obtain a displacement amount of a position of the detected mark from a reference position thereof based on an output of the detector;
wherein the controller is configured to obtain information relating to a position of a shot region on the substrate based on a plurality of ones of the displacement amount respectively obtained based on outputs of the detector with respect to a plurality of ones of the shot region, and obtain, from the plurality of ones of the displacement amount, a representative value of, with respect to each of a plurality of ones of the mark associated with a shot region on the substrate, a plurality of ones of the displacement amount respectively obtained with respect to a plurality of ones of the shot region, and obtain information relating to a magnification of a shot region on the substrate based on a plurality of ones of the representative value respectively obtained with respect to the plurality of ones of the mark.

9. A lithography method of detecting a mark formed on a substrate, obtaining a displacement amount of a position of the detected mark from a reference position thereof based on the detected mark, and forming a pattern on the substrate based on the obtained displacement amount, the method comprising steps of:
obtaining information relating to a position of a shot region on the substrate based on a plurality of ones of the displacement amount respectively obtained with respect to a plurality of ones of the shot region;
obtaining, from the plurality of ones of the displacement amount, a representative value of, with respect to each of a plurality of marks associated with a shot region on the substrate, a plurality of ones of the displacement amount respectively obtained with respect to a plurality of ones of the shot region; and
obtaining information relating to a magnification of a shot region on the substrate based on a plurality of ones of the representative value respectively obtained with respect to the plurality of ones of the mark.

10. A method of manufacturing an article, the method comprising steps of:
forming a pattern on a substrate using a lithography apparatus; and
processing the substrate, on which the pattern has been formed, to manufacture the article,
wherein the lithography apparatus includes:
a detector configured to detect a mark formed on the substrate;
a controller configured to obtain a displacement amount of a position of the detected mark from a reference position thereof based on an output of the detector;
wherein the controller is configured to obtain information relating to a position of a shot region on the substrate based on a plurality of ones of the displacement amount respectively obtained based on outputs of the detector with respect to a plurality of ones of the shot region, and obtain, from the plurality of ones of displacement amount, a representative value of, with respect to each of a plurality of ones of the mark associated with a shot region on the substrate, a plurality of ones of the displacement amount respectively obtained with respect to a plurality of ones of the shot region, and obtain information relating to a magnification of a shot region on the substrate based on a plurality of ones of the representative value respectively obtained with respect to the plurality of ones of the mark.

* * * * *